United States Patent
Schmid et al.

(10) Patent No.: US 10,671,907 B2
(45) Date of Patent: Jun. 2, 2020

(54) ELECTRICAL JUNCTION

(71) Applicant: International Business Machines Corporation, Armonk, NY (US)

(72) Inventors: Heinz Schmid, Waedenswil (CH); Bernd Gotsmann, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/587,959

(22) Filed: Sep. 30, 2019

(65) Prior Publication Data
US 2020/0035609 A1 Jan. 30, 2020

Related U.S. Application Data

(62) Division of application No. 15/922,167, filed on Mar. 15, 2018.

(51) Int. Cl.
| | |
|---|---|
| *H01L 23/532* | (2006.01) |
| *G06N 3/02* | (2006.01) |
| *H01L 23/528* | (2006.01) |
| *H01B 1/16* | (2006.01) |
| *H01L 43/02* | (2006.01) |
| *H01L 23/522* | (2006.01) |

(52) U.S. Cl.
CPC ............... *G06N 3/02* (2013.01); *H01B 1/16* (2013.01); *H01L 23/528* (2013.01); *H01L 23/5221* (2013.01); *H01L 23/5329* (2013.01); *H01L 23/53209* (2013.01); *H01L 23/53271* (2013.01); *H01L 43/02* (2013.01)

(58) Field of Classification Search
CPC .................................................. H01L 23/53209
USPC ................................................................... 257/750
See application file for complete search history.

(56) References Cited

U.S. PATENT DOCUMENTS

| | | | | |
|---|---|---|---|---|
| 5,825,623 | A * | 10/1998 | Lee | B29C 45/34 |
| | | | | 361/707 |
| 8,874,496 | B2 * | 10/2014 | Lazar | H03M 1/82 |
| | | | | 706/16 |
| 9,362,227 | B2 * | 6/2016 | Zhang | H01L 23/53204 |
| 10,256,391 | B2 * | 4/2019 | Gooth | H01L 35/14 |
| 2006/0167784 | A1 * | 7/2006 | Hoffberg | G06Q 20/401 |
| | | | | 705/37 |
| 2006/0216969 | A1 * | 9/2006 | Bright | H01R 13/6471 |
| | | | | 439/79 |

(Continued)

OTHER PUBLICATIONS

Acero, S., et al., "Transport in Selectively Magnetically Doped Topological Insulator Wires", arXiv:1510.00261v1 [cond-mat.mes-hall], Oct. 1, 2015, 8 pages.

(Continued)

*Primary Examiner* — Jami Valentine Miller
(74) *Attorney, Agent, or Firm* — Scully, Scott, Murphy & Presser. P.C.; Daniel P. Morris

(57) ABSTRACT

An electrical junction comprising a first pair of leads and a second pair of leads. The first pair of leads and the second pair of leads comprise a Weyl semimetal. The junction comprises an electrical crossing arranged between the leads of the first pair and the leads of the second pair and is configured to provide an electrical connection between the leads of the first pair and the leads of the second pair. A related electrical device and a related neural network may be also presented.

20 Claims, 5 Drawing Sheets

(56) References Cited

U.S. PATENT DOCUMENTS

| | | | | |
|---|---|---|---|---|
| 2007/0027074 | A1* | 2/2007 | Holmes | C07K 14/505 514/1.8 |
| 2009/0246980 | A1* | 10/2009 | Knaub | H01R 13/6471 439/65 |
| 2010/0317420 | A1* | 12/2010 | Hoffberg | G06Q 30/0207 463/1 |
| 2013/0237899 | A1* | 9/2013 | Pepperberg | A61N 5/062 604/20 |
| 2016/0035674 | A1 | 2/2016 | Zhang et al. | |
| 2017/0047506 | A1 | 2/2017 | Annunziata et al. | |
| 2018/0026185 | A1* | 1/2018 | Chan | H01L 49/003 250/338.4 |
| 2019/0067547 | A1* | 2/2019 | Gooth | H01L 35/00 |

OTHER PUBLICATIONS

Wolpert, D., et al., "NAND Gate Design for Ballistic Deflection Transistors", Manuscript Received Dec. 18, 2008, revised Jul. 1, 2009, IEEE Transactions on Nanotechnology, Jan. 2011, 5 pages, vol. 10, No. 1.

Rickhaus, P., et al., "Gate tuneable beamsplitter in ballistic graphene", Applied Physics Letters 107, Received Sep. 21, 2015, Accepted Nov. 4, 2015, Published online Dec. 21, 2015, pp. 251901-251901-5.

Chen, Y.L., et al., Massive Dirac Fermion on the Surface of a Magnetically Doped Topological Insulator, Science, Aug. 6, 2010, pp. 659-662, vol. 329.

Henk, J., et al., "Topological Character and Magnetism of the Dirac State in Mn-Doped Bu2 Te3", Physical Review Letters, Received Apr. 10, 2012, Published Aug. 16, 2012, pp. 076801-1-076801-5, 109.

Wray, L.A., et al., "A topological insulator surface under strong coulomb, magnetic and disorder perturbations", Nature Physics, Published online Dec. 12, 2010, Jan. 2011, pp. 32-37, vol. 7.

List of IBM Patents or Patent Applications Treated as Related dated Sep. 30, 2019, 2 pages.

Office Action dated Nov. 5, 2019 received in U.S. Appl. No. 15/922,167, 19 pages.

* cited by examiner

ELECTRICAL JUNCTION

BACKGROUND

Aspects of the present invention relate generally to electrical junctions arranged between electrical conductors.

Further aspects relate to electrical devices comprising electrical junctions and neural networks comprising electrical junctions.

Neural networks are widely used in pattern recognition and classification, with many potential applications. The parameters (e.g., 'synaptic weights') of the neural network may be adaptively trained on a set of patterns during a learning process, following which the neural network is able to recognize or classify patterns of the same kind.

Neural network applications may include pattern recognition, classification, and identification of fingerprints, faces, voiceprints, similar portions of text, similar strings of genetic code, prediction of the behavior of systems etc.

Hardware implementations of neural network architectures require a multitude of interconnects to connect all outputs of neurons from one layer to the inputs of neurons from the next layer. The number of such connections may be very large in preferred systems. Their physical implementation is challenging because current hardware fabrication relies mostly on 2D fabrication techniques. However, with such 2D fabrication techniques the signal lines cannot be crossed without creating a shortcut. Also multi-layer CMOS implementations with several metal layers have limited capabilities to solve this issue.

Accordingly, it is generally desirable to provide other electrical junctions, in particular electrical junctions that facilitate an integration of crossings between electrical wires with high density.

SUMMARY

According to a first aspect, the invention is embodied as an electrical junction comprising a first pair of leads and a second pair of leads. The first pair of leads and the second pair of leads comprise a Weyl semimetal. The junction comprises an electrical crossing arranged between the leads of the first pair and the leads of the second pair and is configured to provide an electrical connection between the leads of the first pair and the leads of the second pair.

The leads may be in particular electrical wires. The electrical crossing, which may also be denoted as electrical node, provides an electrical connection between the leads of the first pair and the leads of the second pair. In other words, the electrical crossing is understood as the central part of the junction at which the leads converge and at which they are electrically connected with each other.

According to embodiments, the Weyl semimetal of the leads of the first pair is magnetized in a first magnetization direction and the Weyl semimetal of the leads of the second pair is magnetized in a second magnetization direction. The second magnetization direction is different from the first magnetization direction.

While the Weyl-semimetal of the first pair of leads and the Weyl-semimetal of the second pair of leads are magnetized in different magnetization directions, the electrical crossing is not magnetized.

An overview of the current research on Weyl semimetals is provided by Shuang Jia, Su-Yang Xu and M. Zahid Hasan Weyl in the document "Weyl semimetals, Fermi arcs and chiral anomalies", 1140 NATURE MATERIALS, VOL 15, NOV. 2016. According to this document "Weyl semimetals are semimetals or metals whose quasiparticle excitation is the Weyl fermion, a particle that played a crucial role in quantum field theory, but has not been observed as a fundamental particle in vacuum. Weyl fermions have definite chiralities, either left-handed or right-handed. In a Weyl semimetal, the chirality can be understood as a topologically protected chiral charge. Weyl nodes of opposite chirality are separated in momentum space and are connected only through the crystal boundary by an exotic non-closed surface state, the Fermi arcs. Weyl fermions are robust while carrying currents, giving rise to exceptionally high mobilities. Their spins are locked to their momentum directions, owing to their character of momentum-space magnetic monopole configuration. Because of the chiral anomaly, the presence of parallel electric and magnetic fields can break the apparent conservation of the chiral charge, making a Weyl metal, unlike ordinary nonmagnetic metals, more conductive with an increasing magnetic field."

Embodiments of the invention may facilitate cost-efficient mass fabrication of electrical junctions. Furthermore, electrical junctions according to embodiments of the invention may provide low power operation and high integration densities.

According to an embodiment the first pair of leads and the second pair of leads are configured to transport Weyl-fermions. The Weyl-fermions may be in particular embodied as electronic excitations.

Hence according to such an embodiment electrical signals that shall be transferred between the two leads of the first pair or between the two leads of the second pair are represented by Weyl-fermions.

The first magnetization direction is parallel to a direction of propagation of the Weyl-fermions in the first pair of leads and the second magnetization direction is antiparallel to the direction of propagation of the Weyl-fermions in the second pair of leads.

Central part of junction can be a Weyl material or another conductive material (metal/semiconductor) which does not lead to scattering of the carriers.

Hence embodiments of the invention exploit the topologically protected transport of Weyl fermions inside the Weyl semimetals in order to reduce or minimize a cross coupling of the electrical signal that shall be transported between the leads of the first pair into the leads of the second pair during its transport through the crossing. Likewise, embodiments of the invention exploit the ballistic, but topologically protected transport of Weyl fermions inside the Weyl semimetals in order to reduce or minimize a cross coupling of the electrical signal that shall be transported between the leads of the second pair into the leads of the first pair during its transport through the crossing.

According to embodiments, the first pair of leads is configured to transport Weyl-fermions of a first chirality and the second pair of leads is configured to transport Weyl-fermions of a second chirality. The first chirality may be in particular a right-handed chirality and the second chirality may be in particular a left-handed chirality.

The first pair of leads comprises a plurality of first magnetized elements being configured to apply a directed magnetic field in the first magnetization direction on the Weyl-semimetal of the first pair of leads and the second pair of leads comprises a plurality of magnetized elements being configured to apply a directed magnetic field in the second magnetization direction on the Weyl-semimetal of the second pair of leads.

According to embodiments, the plurality of first magnetized elements and the plurality of second magnetized elements are arranged adjacent to the Weyl-semimetal of the first pair of leads and adjacent to the Weyl semimetal of the second pair of leads respectively.

This allows for an efficient application of magnetic fields on the Weyl-semimetal. The attachment of the first and the second magnetized elements to the Weyl-semimetal may be performed with fabrication methods known to a skilled person in the art such as e.g. gluing, metal deposition through a mask, lithography processes, and self-assembly processes.

According to embodiments, the plurality of first magnetized elements are embodied as magnetized layers and/or the plurality of second magnetized elements are embodied as magnetized layers.

According to embodiments, the plurality of first magnetized elements are embedded in the Weyl semimetal of the first pair of leads and the plurality of second magnetized elements are embedded in the Weyl semimetal of the second pair of leads. This allows for an efficient application of magnetic fields on the Weyl-semimetal. Such Weyl-semimetals with embedded magnetized elements may be fabricated with fabrication methods known to a skilled person in the art such as e.g. doping with magnetic elements during the crystal growth of the Weyl semimetal or placing a magnetic film in proximity According to embodiments, the plurality of first magnetized elements and/or the plurality of second magnetized elements comprise rare earth magnets.

According to further embodiments, the plurality of first magnetized elements and/or the plurality of second magnetized elements comprise a material selected from the group consisting of Neodymium-iron-boron, manganese aluminum, samarium cobalt and aluminum nickel cobalt.

According to embodiments, the Weyl-semimetal may be in particular TaAs, NbP or TaP. According to other embodiments, the Weyl semimetal may be RPtBi or GdPtBi. These materials turn into a Weyl semimetal by applying a magnetic field B.

According to other embodiments, the Weyl-semimetal may be a Dirac metal. The Dirac metal may be in particular $Cd_2As_3$ or $Na_3Bi$. Such Dirac metals turn into a Weyl semimetal by the application of a magnetic field B.

According to embodiments, a crossing angle between the leads of the first pair and the leads of the second pair is less than 30 degree, in particular less than 20 degree.

Such embodiments further reduce or minimize the cross coupling of an electrical signal of one of the pair of leads into the other pair of leads.

According to embodiments, the crossing is configured to provide a distance, which may also be denoted as transport length, between the leads of the first pair that is sufficiently small to keep the first chirality of the Weyl-fermions during their transport through the crossing and to provide a distance (transport length) between the leads of the second pair that is sufficiently small to keep the second chirality of the Weyl-fermions during their transport through the crossing.

While in the leads of the first pair and the leads of the second pair the respective chirality is maintained or in other words enforced or in other words supported by the corresponding magnetization of the leads, such a maintenance, enforcement or support is missing during the transport of the Weyl-fermions through the crossing due to an absence of a corresponding magnetic field in the crossing. But by providing limited physical dimensions e.g. ensuring ballistic, scattering-free transport, of the crossing and thereby limiting the distance that the Weyl-fermions have to travel between the respective leads without magnetization support, the respective chirality of the Weyl-fermions can be kept nevertheless.

According to embodiments, the crossing is configured to provide a distance between the leads of the first pair and the leads of the second pair between 50 nm and 300 nm.

According to embodiments, the crossing comprises a non-magnetized Weyl-semimetal.

According to an embodiment of another aspect of the invention, an electrical device comprising a plurality of junctions according to the first aspect is provided. This is in particular advantageous for electrical devices with a large number of electrical connections and corresponding crossings.

According to an embodiment of another aspect of the invention, a neural network is provided. The neural network comprises a plurality of neurons, a plurality of connections between the neurons and a plurality of junctions according to first aspect. The plurality of junctions is configured to provide a plurality of crossings between the pluralities of connections.

Embodiments of the invention will be described in more detail below, by way of illustrative and non-limiting examples, with reference to the accompanying drawings.

DETAILED DESCRIPTION

Figure 1:
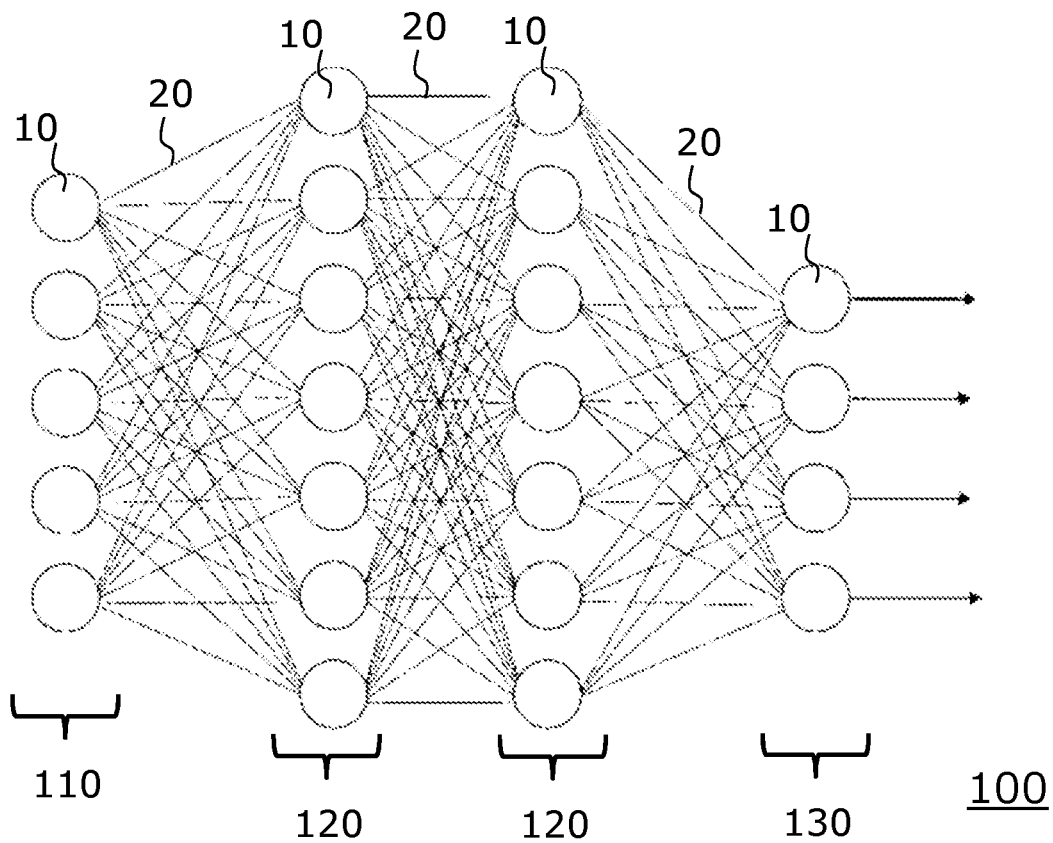
FIG. 1 shows a schematic view of a neural network according to an embodiment of the invention.

FIG. 1 shows a schematic view of a neural network 100 according to an embodiment of the invention. The neural network 100 comprises an input layer 110 comprising a plurality of neurons 10, two hidden layers 120 comprising a plurality of neurons 10 and an output layer 130 comprising a plurality of neurons 10. The neural network 100 comprises a plurality of electrical connections 20 between the neurons 10. The electrical connections 20 connect the outputs of neurons from one layer, e.g. from the input layer 110, to the inputs of neurons from the next layer, e.g. one of the hidden layers 120. As illustrated in FIG. 1, the number of such connections 20 may be very large.

Figure 2:
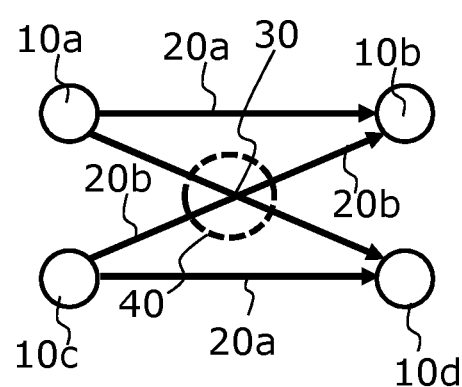
FIG. 2 shows a more detailed view of a part of a neural network according to an embodiment of the invention.

FIG. 2 shows a more detailed view of a part of a neural network 200 according to an embodiment of the invention. The neural network 200 comprises four neurons 10*a*, 10*b*, 10*c* and 10*d*. The two upper neurons 10*a* and 10*b* and the two lower neurons 10*c* and 10*d* are connected by electrical connections 20*a* which have no crossings with other electrical connections. The upper neuron 10*a* and the lower neuron 10*d* as well as the lower neuron 10*c* and the upper neuron 10*b* are connected by electrical connections 20*b* which cross each other at a crossing 30. The crossing 30 forms a central point of an electrical junction 40.

Figure 3:
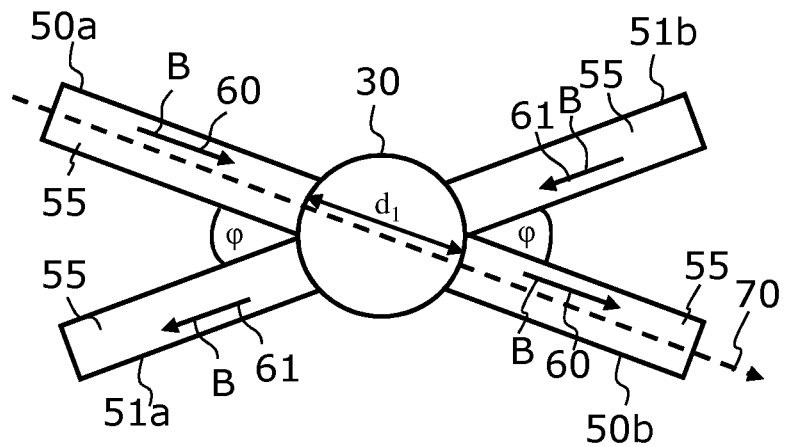
FIG. 3 illustrates a signal flow of an electrical signal in a first pair of leads of an electrical junction according to an embodiment of the invention.
Figure 4:
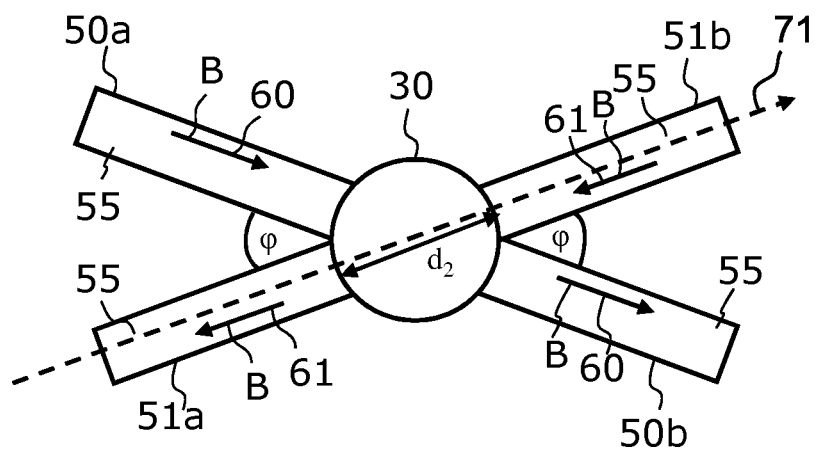
FIG. 4 illustrates a signal flow of an electrical signal in a second pair of leads of an electrical junction according to an embodiment of the invention.

FIG. 3 and FIG. 4 show an enlarged view of the electrical junction 40 of FIG. 2 and illustrates the desired signal flow of the electrical junction 40.

The electrical junction 40 comprises a first pair of leads comprising a lead 50*a* and a lead 50*b*. Furthermore, the electrical junction 40 comprises a second pair of leads comprising a lead 51*a* and a lead 51*b*. The leads 50*a*, 50*b* as well as the leads 51*a* and 51*b* each comprise a Weyl semimetal 55. The electrical crossing 30 is arranged between the leads 50*a*, 50*b* of the first pair and the leads 51*a*, 51*b* of the second pair. The electrical crossing 30 provides an electrical connection between the leads 50*a*, 50*b* as well as between the leads 51*a* and 51*b*.

The Weyl semimetal 55 of the leads 50*a*, 50*b* of the first pair is magnetized in a first magnetization direction 60 and the Weyl semimetal 55 of the leads 51*a*, 51*b* of the second pair is magnetized in a second magnetization direction 61.

The Weyl semimetal 55 is a new state of matter that hosts Weyl fermions as emergent quasiparticles and admits a topological classification that protects Fermi arc surface states on the boundary of a bulk sample. Weyl semimetals have an unusual band structure in which the linearly dispersing valence and conduction bands meet at discrete "Weyl points."

According to some embodiments, the Weyl-semimetal 55 may comprise TaAs, NbP or TaP.

According to other embodiments, the Weyl-semimetal 55 may be a Dirac metal. Such a Dirac metal turns into a Weyl semimetal by the application of the magnetic field B. Such a Dirac metal may be e.g. Cd2As3 or Na3Bi.

According to other embodiments, the Weyl semimetal 55 may comprise RPtBi or GdPtBi. These materials turn also into a Weyl semimetal by applying the magnetic field B.

FIG. 3 illustrates a signal flow of an electrical signal 70 in the first pair comprising the leads 50*a* and 50*b*. The electrical signal 70 is e.g. a signal that shall be transferred from the neuron 10*a* to the neuron 10*d*. Accordingly, it is desired that the electrical signal 70 is forwarded from the lead 50*a* only to the lead 50*b*. More particularly, according to embodiments of the invention any crosstalk of the electrical signal 70 into the lead 51*b* of the second pair shall be minimized and preferably completely avoided. The electrical signal 70 may be in particular embodied as Weyl-fermions that are transported by the leads 50*a*, 50*b* of the first pair.

FIG. 4 illustrates a signal flow of an electrical signal 71 in the second pair comprising the leads 51*a* and 51*b*. The electrical signal 71 is e.g. a signal that shall be transferred from the neuron 10*c* to the neuron 10*b*. Accordingly, it is desired that the electrical signal 71 is forwarded from the lead 51*a* only to the lead 51*b*. More particularly, according to embodiments of the invention any crosstalk of the electrical signal 71 into the lead 50*b* of the first pair shall be minimized and preferably completely avoided. The electrical signal 71 may be in particular embodied as Weyl-fermions that are transported by the leads 51*a*, 51*b* of the second pair.

The separation of the two electrical signals 70, 71 is achieved by the different magnetization directions of the Weyl semimetal 55. More particularly, the first magnetization direction 60 of the leads 50*a*, 50*b* of the first pair is parallel to the direction of propagation of the electrical signal 70, i.e. the Weyl-fermions in the first pair of leads. And the second magnetization direction 61 of the leads 51*a*, 51*b* of the second pair is antiparallel to the direction of propagation of the electrical signal 71, i.e. the Weyl-fermions in the second pair of leads. As a result of such a different magnetization of the leads 50*a*, 50*b* of the first pair and the leads 51*a*, 51*b* of the second pair, the leads 50*a*, 50*b* of the first pair are configured to transport Weyl-fermions of a first chirality and the leads 51*a*, 51*b* of the second pair are configured to transport Weyl-fermions of a second chirality. According to embodiments, the first chirality is a right-handed chirality and the second chirality is a left-handed chirality. According to other embodiments, the second chirality is a right-handed chirality and the first chirality is a left-handed chirality.

The chirality may be defined as the product of the spin of the Weyl-fermions and the direction of propagation of the Weyl-fermions.

Between the leads 50*a*, 50*b* of the first pair and the leads 51*a*, 51*b* of the second pair a crossing angle φ is provided. The crossing angle φ is according to preferred embodiments less than 30 degree and according to even more preferred embodiments less than 20 degree. Such rather small crossing angles facilitate an efficient separation of the electrical signals 70 and 71 and reduce and/or minimize any crosstalk between the different pairs of leads.

According to preferred embodiments, the crossing 30 provides a distance $d_1$ between the leads 50*a* and 50*b* of the first pair that is sufficiently small to keep the first chirality of the Weyl-fermions during their transport through the crossing 30. The distance $d_1$ may be also denoted as transport length.

Furthermore, according to preferred embodiments, the crossing 30 provides a distance $d_2$ between the leads 51*a* and 51*b* of the second pair that is sufficiently small to keep the second chirality of the Weyl-fermions during their transport through the crossing 30. The distance $d_2$ may be also denoted as transport length.

According to embodiments the distance $d_1$ between the leads 50*a* and 50*b* of the first pair and the distance $d_2$ between the leads 51*a*, 51*b* of the second pair is between 100 nm and 300 nm.

According to the embodiment of FIGS. 3 and 4, the crossing 30 has a circular shape. However, according to other embodiments other shapes may be provided, e.g. hexagonal or octagonal shapes or other suitable shapes.

The material of the crossing 30 may be according to embodiments a metallic material. According to preferred embodiments the material of the crossing may be a non-magnetized Weyl-semimetal.

Figure 5:
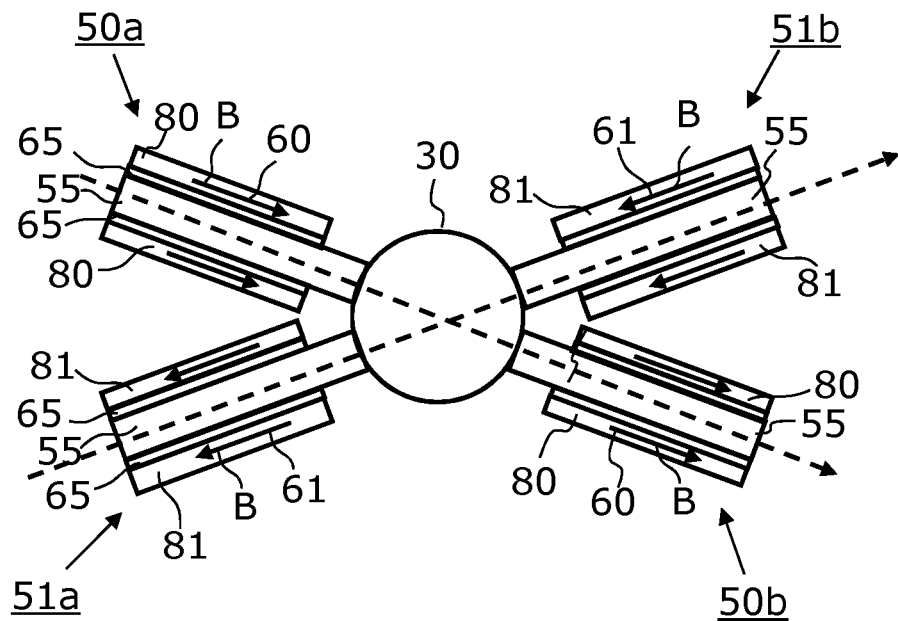
FIG. 5 shows an electrical junction according to an embodiment of the invention comprising magnetized elements adjacent to a Weyl-semimetal.

FIG. 5 shows an electrical junction 500 according to an embodiment of the invention.

The electrical junction 500 comprises a first pair of leads comprising a lead 50*a* and a lead 50*b*. Furthermore, the electrical junction 500 comprises a second pair of leads comprising a lead 51*a* and a lead 51*b*. The leads 50*a*, 50*b* as well as the leads 51*a* and 51*b* each comprise a Weyl semimetal 55. An electrical crossing 30 is arranged between the leads 50a, 50b of the first pair and the leads 51a, 51b of the second pair.

The first pair 50 of leads 50a, 50b comprises first magnetized elements 80 which are arranged adjacent to the Weyl-semimetal of the first pair of leads 50a, 50b. The magnetized elements 80 apply a directed magnetic field B in the first magnetization direction 60 on the Weyl-semimetal 55 of the first pair of leads 50a, 50b. The magnetized elements 80 are electrically insulated from the Weyl semimetal 55 by an insulating layer 65.

The second pair of leads 51a, 51b comprises second magnetized elements 81 which are arranged adjacent to the Weyl-semimetal of the second pair of leads 51a, 51b. The magnetized elements 81 apply a directed magnetic field B in the second magnetization direction 61 on the Weyl-semimetal of the second pair of leads 51a, 51b.

The magnetized elements 81 are electrically insulated from the Weyl semimetal 55 by an insulating layer 65.

Accordingly, the Weyl semimetal 55 of the leads 50a, 50b of the first pair is magnetized in the first magnetization direction 60 and the Weyl semimetal of the leads 51a, 51b of the second pair is magnetized in the second magnetization direction 61.

According to embodiments, the first magnetized elements 80 and the second magnetized elements 81 may comprise rare earth magnets. According to other embodiments, the magnetized elements 80, 81 may comprise Neodymium-iron-boron, mangan aluminum, samarium cobalt or aluminum nickel cobalt.

Figure 6:
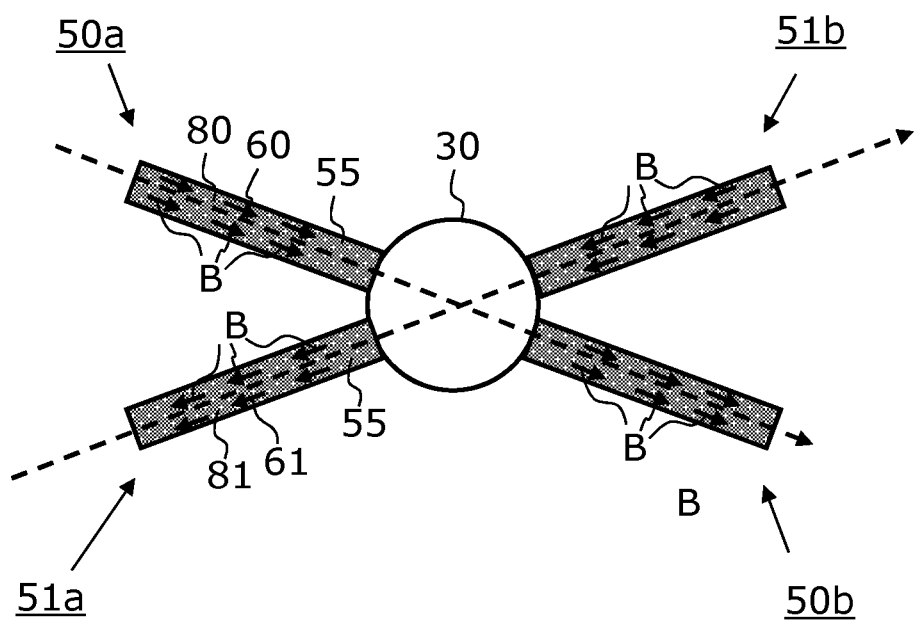
FIG. 6 shows an electrical junction according to an embodiment of the invention comprising magnetized elements embedded in a Weyl-semimetal.

FIG. 6 shows an electrical junction 600 according to an embodiment of the invention.

The electrical junction 600 comprises a first pair of leads comprising a lead 50a and a lead 50b. Furthermore, the electrical junction 600 comprises a second pair of leads comprising a lead 51a and a lead 51b. The leads 50a, 50b as well as the leads 51a and 51b each comprise a Weyl semimetal 55. The Weyl semimetal 55 is illustrated with a grey-shading. An electrical crossing 30 is arranged between the leads 50a, 50b of the first pair and the leads 51a, 51b of the second pair.

The first pair of leads 50a, 50b comprises a plurality of first magnetized elements 80 which are embedded in the Weyl semimetal of the leads 50a, 50b. The first magnetized elements 80 are illustrated with white dots in FIG. 6. The embedded magnetized elements 80 may be in particular atoms. The embedded magnetized elements 80 may be integrated into the Weyl-semimetal e.g. by magnetic doping techniques. The magnetized elements 80 apply a directed magnetic field B in the first magnetization direction 60 on the Weyl-semimetal of the first pair of leads 50a, 50b.

The second pair of leads 51a, 51b comprises a plurality of second magnetized elements 81 which are embedded in the Weyl semimetal of the leads 51a, 51b. The second magnetized elements 81 are illustrated with white dots in FIG. 6. The embedded magnetized elements 81 may be in particular atoms. The embedded magnetized elements 81 may be integrated into the Weyl-semimetal e.g. by magnetic doping techniques. The second magnetized elements 81 apply a directed magnetic field B in the second magnetization direction 61 on the Weyl-semimetal of the second pair of leads 51a, 51b.

Figure 7:
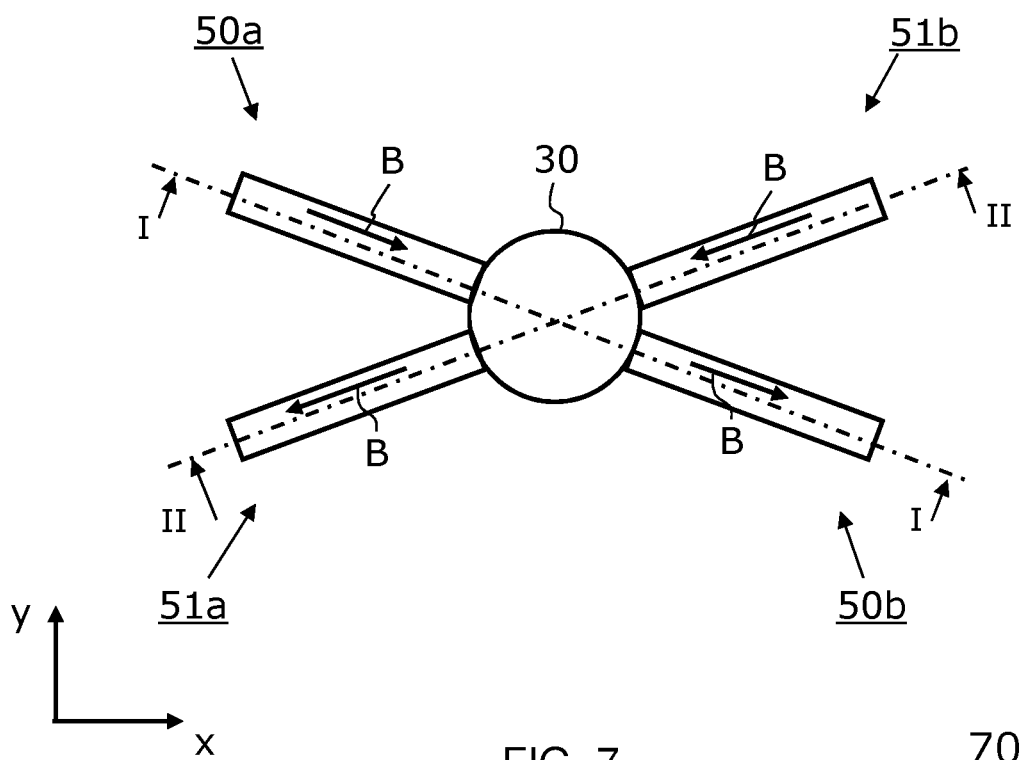
FIG. 7 shows a top view of an electrical junction according to an embodiment of the invention having a layer of magnetized elements on top of the Weyl-semimetal.

FIG. 7 shows a top view of an electrical junction 700 according to an embodiment of the invention.

The electrical junction 700 comprises a first pair of leads comprising a lead 50a and a lead 50b. Furthermore, the electrical junction 700 comprises a second pair of leads comprising a lead 51a and a lead 51b. The leads 50a, 50b as well as the leads 51a and 51b each comprise a Weyl semimetal. An electrical crossing 30 is arranged between the leads 50a, 50b of the first pair and the leads 51a, 51b of the second pair.

Figure 8A:
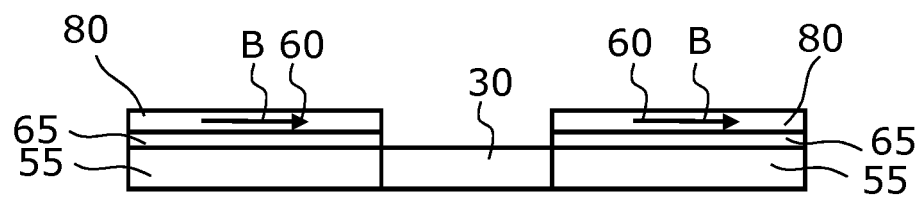
FIG. 8a shows a corresponding cross-sectional view of a first pair of leads and a crossing taken along the section line I-I of FIG. 7.

FIG. 8a shows a corresponding cross-sectional view of the first pair and the crossing 30 taken along the section line I-I of FIG. 7.

Figure 8B:
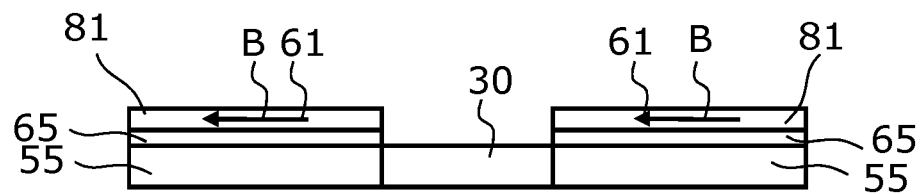
FIG. 8b shows a corresponding cross-sectional view of a second pair of leads and the crossing taken along the section line II-II of FIGS. 7.

FIG. 8b shows a corresponding cross-sectional view of the second pair and the crossing 30 taken along the section line II-II of FIG. 7.

The first pair of leads 50a, 50b comprises first magnetized elements 80 which are embodied as magnetized layers and are arranged on top of the Weyl semimetal 55 of the first pair of leads 50a, 50b. An insulating layer 65 is provided between the first magnetized elements 80 and the Weyl semimetal 55. The first magnetized elements 80 apply a directed magnetic field B in the first magnetization direction 60 on the Weyl-semimetal 55 of the first pair of leads 50a, 50b.

The second pair of leads 51a, 51b comprises second magnetized elements 81 which are also embodied as magnetized layers and are arranged on top of the Weyl semimetal 55 of the second pair of leads 51a, 51b. An insulating layer 65 is provided between the second magnetized elements 81 and the Weyl semimetal 55. The second magnetized elements 81 apply a directed magnetic field B in the second magnetization direction 61 on the Weyl-semimetal 55 of the second pair of leads 51a, 51b.

Figure 9:
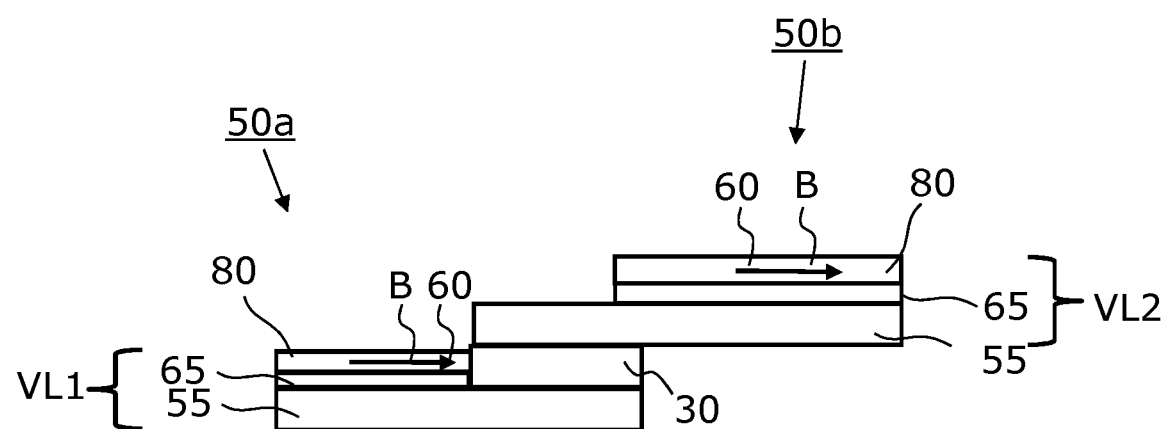
FIG. 9 shows a cross-sectional view of another embodiment taken along the section line I-I of FIG. 7, comprising a vertical junction.

FIG. 9 shows a cross-sectional view of another embodiment of an electrical junction, taken along the section line I-I of FIG. 7. The electrical junction according to this embodiment comprises a lead 50a of the first pair of leads and a lead 50b of the first pair which are arranged in different vertical layers, i.e. in a different vertical positions in the vertical z-direction. More particularly, the lead 50a is arranged in a vertical layer VL1 and the lead 50b in a vertical layer VL2. In other words, the lead 50b is arranged in a higher layer above the lead 50a with respect to the vertical z-direction.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A neural network comprising:
a plurality of neurons;
a plurality of connections between the neurons; and
a plurality of junctions configured to provide a plurality of crossings between the plurality of connections,
wherein a junction of the plurality of junctions includes at least:
a first pair of leads comprising a Weyl semimetal;
a second pair of leads comprising a Weyl semimetal; and
an electrical crossing arranged between the leads of the first pair and the leads of the second pair and configured to provide an electrical connection between the leads of the first pair and the leads of the second pair, wherein any crosstalk between electrical signals of the first pair and the second pair is minimized.

2. The neural network of claim 1, wherein the Weyl semimetal of the leads of the first pair is magnetized in a first magnetization direction and the Weyl semimetal of the leads of the second pair is magnetized in a second magnetization direction, the second magnetization direction being different from the first magnetization direction.

3. The neural network of claim 2, wherein
the first pair of leads and the second pair of leads are configured to transport Weyl-fermions;
the first magnetization direction is parallel to a direction of propagation of the Weyl-fermions in the first pair of leads; and
the second magnetization direction is antiparallel to the direction of propagation of the Weyl-fermions in the second pair of leads.

4. The neural network of claim 1, wherein
the first pair of leads is configured to transport Weyl-fermions of a first chirality; and
the second pair of leads is configured to transport Weyl-fermions of a second chirality.

5. The neural network of claim 2, wherein
the first pair of leads comprises a plurality of first magnetized elements being configured to apply a directed magnetic field in the first magnetization direction on the Weyl-semimetal of the first pair of leads; and
the second pair of leads comprises a plurality of magnetized elements being configured to apply a directed magnetic field in the second magnetization direction on the Weyl-semimetal of the second pair of leads.

6. The neural network of claim 5, wherein
the plurality of first magnetized elements and the plurality of second magnetized elements are arranged adjacent to the Weyl-semimetal of the first pair of leads and adjacent to the Weyl semimetal of the second pair of leads respectively.

7. The neural network of claim 5, wherein the plurality of first magnetized elements are embodied as magnetized layers and/or the plurality of second magnetized elements are embodied as magnetized layers.

8. The neural network of claim 5, wherein the plurality of first magnetized elements are embedded in the Weyl semimetal of the first pair of leads and the plurality of second magnetized elements are embedded in the Weyl semimetal of the second pair of leads.

9. The neural network of claim 1, wherein the leads of the first pair of leads and/or the leads of the second pair of leads are arranged in different vertical layers.

10. The neural network of claim 5, wherein the plurality of first magnetized elements and/or the plurality of second magnetized elements comprise rare earth magnets.

11. The neural network of claim 5, wherein the plurality of first magnetized elements and/or the plurality of second magnetized elements comprise a material selected from the group consisting of: Neodymium-iron-boron, manganese aluminum, samarium cobalt and aluminum nickel cobalt.

12. The neural network of claim 1, wherein the Weyl-semimetal is selected from the group consisting of: TaAs, NbP, TaP, RPtBi and GdPtBi.

13. The neural network of claim 1, wherein the Weyl-semimetal is a Dirac metal.

14. The neural network of claim 13, wherein the Dirac metal is selected from the group consisting of: $Cd_2As_3$ and $Na_3Bi$.

15. The neural network of claim 1, wherein a crossing angle between the leads of the first pair and the leads of the second pair is less than 30 degree, in particular less than 20 degree.

16. The neural network of claim 4, wherein
the crossing is configured
to provide a distance between the leads of the first pair that is sufficiently small to keep the first chirality of the Weyl-fermions during their transport through the crossing; and
to provide a distance between the leads of the second pair that is sufficiently small to keep the second chirality of the Weyl-fermions during their transport through the crossing.

17. The neural network of claim 1, wherein the crossing is configured to provide a distance between the leads of the first pair and the leads of the second pair between 50 nm and 300 nm.

18. The neural network of claim 1, wherein the crossing comprises a non-magnetized Weyl-semimetal.

19. A method of implementing a neural network, comprising:
providing a plurality of neurons;
providing a plurality of connections between the neurons; and
providing a plurality of junctions configured to provide a plurality of crossings between the plurality of connections, wherein providing a junction of the plurality of junctions includes at least:
providing a first pair of leads comprising a Weyl semimetal;
providing a second pair of leads comprising a Weyl semimetal; a
providing an electrical crossing arranged between the leads of the first pair and the leads of the second pair, configured to provide an electrical connection between the leads of the first pair and the leads of the second pair, wherein any crosstalk between electrical signals of the first pair and the second pair is minimized.

20. The method of claim 19, wherein the Weyl semimetal of the leads of the first pair is magnetized in a first magnetization direction and the Weyl semimetal of the leads of the second pair is magnetized in a second magnetization direction, the second magnetization direction being different from the first magnetization direction.

* * * * *